United States Patent
Roh et al.

(10) Patent No.: US 7,218,265 B2
(45) Date of Patent: May 15, 2007

(54) CMOS IMAGE CAPTURE DEVICE WITH SELF-CORRECTING GAIN CHARACTERISTIC

(75) Inventors: Jae-seob Roh, Gyeonggi-do (KR); Jung-hyun Nam, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/279,141

(22) Filed: Apr. 10, 2006

(65) Prior Publication Data

US 2006/0290552 A1    Dec. 28, 2006

(30) Foreign Application Priority Data

Jun. 23, 2005    (KR) ............. 10-2005-0054364

(51) Int. Cl.
    *H03M 1/56*    (2006.01)
(52) U.S. Cl. .............. 341/169; 348/246; 348/294; 348/308; 341/155
(58) Field of Classification Search .......... 341/169, 341/155, 120, 117, 118, 119; 348/294, 246, 348/230.1, 308; 345/98; 250/208.1
    See application file for complete search history.

(56) References Cited

U.S. PATENT DOCUMENTS

| | | | |
|---|---|---|---|
| 6,329,974 B1 * | 12/2001 | Walker et al. ............ 345/98 |
| 6,423,957 B1 * | 7/2002 | Kim et al. ............ 250/208.1 |
| 6,633,335 B1 * | 10/2003 | Kwon et al. ............ 348/308 |
| 6,707,493 B1 * | 3/2004 | Lee et al. ............ 348/246 |
| 6,727,486 B2 * | 4/2004 | Choi ............ 250/208.1 |
| 6,867,804 B1 * | 3/2005 | Kim et al. ............ 348/294 |
| 6,885,331 B2 * | 4/2005 | Krymski ............ 341/169 |
| 2004/0046685 A1 * | 3/2004 | Yun et al. ............ 341/169 |
| 2004/0109070 A1 * | 6/2004 | Jung ............ 348/230.1 |

FOREIGN PATENT DOCUMENTS

| JP | 09-298690 | 11/1997 |
|---|---|---|
| JP | 2001-203936 | 7/2001 |
| KR | 1020030050089 A | 6/2003 |

* cited by examiner

*Primary Examiner*—Jean Bruner Jeanglaude
(74) *Attorney, Agent, or Firm*—Myers Bigel Sibley & Sajovec, P.A.

(57) ABSTRACT

A CMOS image capture device includes an array of pixel elements configured to convert an image received as light at a surface thereof into analog output signals. An image processing circuit is also provided. The image processing circuit is configured to generate digital output signals from which the image can be recreated in response to the analog output signals. The image processing circuit has self-adjustable gain characteristics. The image processing circuit includes a ramp signal generator having an integration circuit therein with an adjustable RC time constant. The integration circuit includes an operational amplifier and a resistor array and/or a capacitor array electrically coupled to the operational amplifier. This resistor array and/or capacitor array enables the adjustable RC time constant.

19 Claims, 7 Drawing Sheets

CMOS IMAGE CAPTURE DEVICE WITH SELF-CORRECTING GAIN CHARACTERISTIC

REFERENCE TO PRIORITY APPLICATION

This application claims priority to Korean Patent Application No. 10-2005-0054364, filed Jun. 23, 2005, in the Korean Intellectual Property Office, the disclosure of which is hereby incorporated herein by reference.

FIELD OF THE INVENTION

The present invention relates to image capture devices and, more particularly, to CMOS image photography devices.

BACKGROUND OF THE INVENTION

Some image photographing devices may be classified as complementary metal oxide semiconductor (CMOS) image photographing devices or charge coupled image-photographing devices (CCD). CMOS image photographing devices convert optical signals, which are input when a subject is photographed, into digital signals and reproduce images of the subject on a screen using the digital signals.

Figure 1:
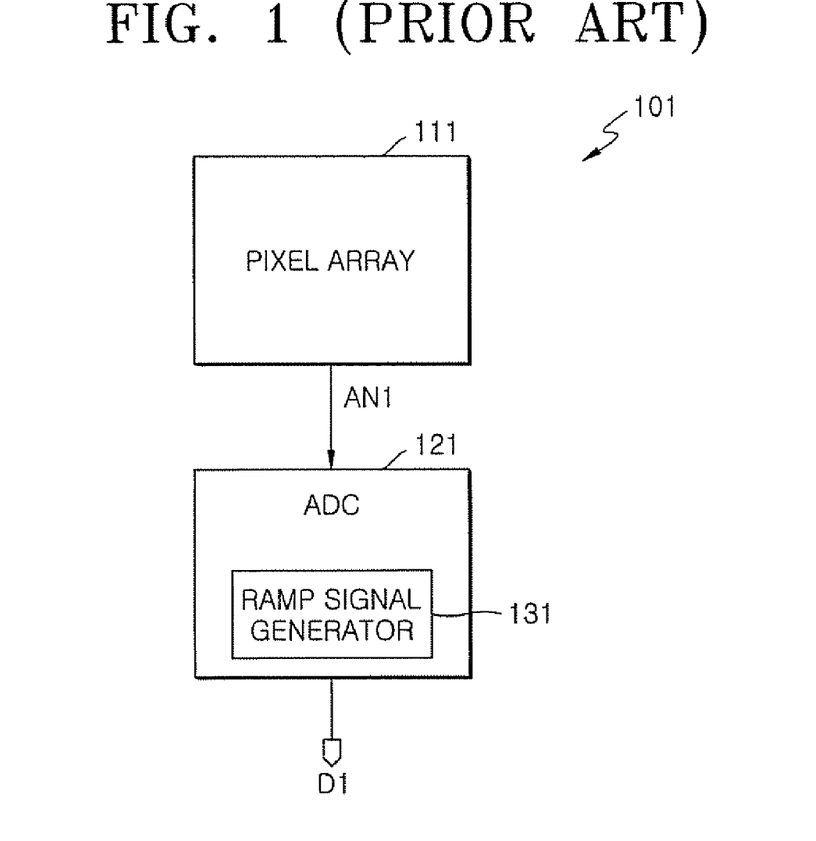
FIG. 1 is a schematic block diagram of a conventional complementary metal oxide semiconductor (CMOS) image-photographing device.

FIG. 1 is a schematic block diagram of a conventional CMOS image-photographing device 101. Referring to FIG. 1, the CMOS image-photographing device 101 includes a pixel array 111 and an analog-to-digital converter (ADC) 121. The pixel array 111, which includes a plurality of pixels, outputs an optical signal from an external source as an analog signal AN1. The ADC 121 includes a ramp signal generator 131. The ADC 121 converts the analog signal AN1 into a digital signal D1 in response to a ramp signal Vramp (see FIG. 2) generated by the ramp signal generator 131 and outputs the digital signal D1.

Figure 2:
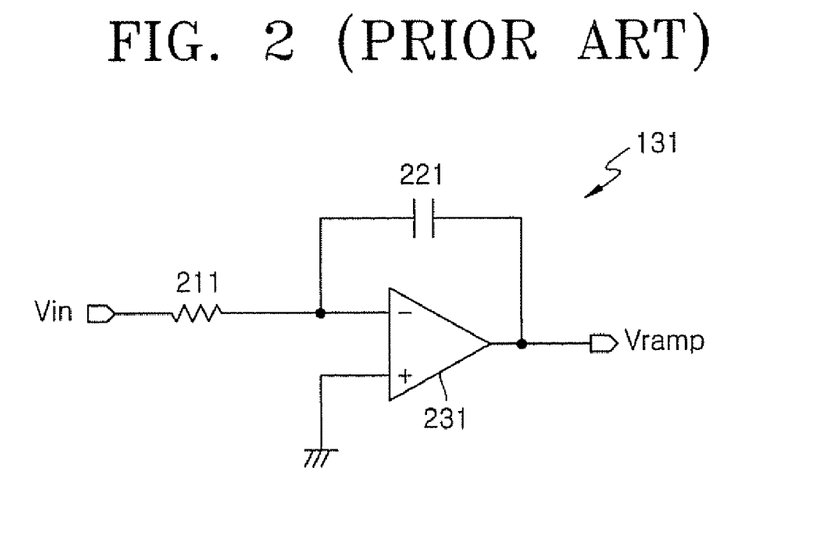
FIG. 2 is a circuit diagram of a ramp signal generator illustrated in FIG. 1.

FIG. 2 is a circuit diagram of the ramp signal generator 131 illustrated in FIG. 1. Referring to FIG. 2, the ramp signal generator 131 includes a resistor 211, a capacitor 221, and an operational amplifier 231. The operational amplifier 231 integrates an input signal Vin from an external source using a resistance of the resistor 211 and a capacitance of the capacitor 221 and outputs the integrated value as the ramp signal Vramp. Here, the ramp signal Vramp determines the gain characteristics of the ADC 121 of FIG. 1.

When fabrication/process margins are insufficient or there are dramatic manufacturing changes, the resistor 211 and the capacitor 221 may not be formed as designed. As a result, the gain characteristics of the CMOS image-photographing device 101 of FIG. 1 may be adversely influenced by process variations and this may result in lower device yield for the device 101.

SUMMARY OF THE INVENTION

Embodiments of the present invention include image capture devices with self-adjustable gain characteristics. An image capture device includes an array of pixel elements configured to convert an image received as light at a surface thereof into analog output signals. A ramp signal generator is provided. The ramp signal generator is configured to generate a ramp voltage in response to a ramp control signal. A first analog-to-digital converter (ADC) is provided. The first ADC is configured to generate first digital signals in response to the analog output signals and the ramp voltage. In some embodiments of the invention, the self-adjustable gain characteristic of the image capture device is provided by a test analog-to-digital converter (ADC) and a digital signal controller. The test ADC is configured to generate test digital signals in response to test analog signals and the ramp voltage and the digital signal controller is configured to generate the ramp control signal and the test analog signals in response to the test digital signals.

In some of these embodiments of the invention, the ramp signal generator includes an integration circuit with an adjustable RC time constant. This adjustable RC time constant is provided by including a resistor array and/or a capacitor array within the integration circuit. This resistor array and/or capacitor array is electrically coupled to an operational amplifier within the integration circuit. The ramp signal generator further comprises a ramp signal controller electrically coupled to the resistor array and/or capacitor array. The ramp signal controller is responsive to the ramp control signal. The ramp signal controller may include a multiplexer responsive to the ramp control signal.

Image capture devices according to further embodiments of the invention include an array of pixel elements configured to convert an image received as light at a surface thereof into analog output signals and an image processing circuit. The image processing circuit is configured to generate digital output signals from which the image can be recreated in response to the analog output signals. The image processing circuit has a self-adjustable gain characteristic. This self-adjustable gain characteristic may be achieved using a ramp signal generator having an integration circuit therein with an adjustable RC time constant. This integration circuit may include an operational amplifier and a resistor array and/or a capacitor array electrically coupled to the operational amplifier.

According to additional embodiments of the invention, a CMOS image-photographing device includes a pixel array including an array of pixels, which receive optical signals from an external source and output analog signals. A ramp signal generator is provided that receives an input signal, integrates the input signal, outputs the integrated signal as a ramp signal, and adjusts a voltage of the ramp signal in response to a ramp control signal. A normal analog-to-digital converter (ADC) is provided. This normal ADC receives the analog signals output from the pixel array and converts the analog signals into digital signals in response to the ramp signal. A test ADC is provided. This test ADC, which has operating characteristics identical to those of the normal ADC, receives a test analog signal, and converts the test analog signal into a digital signal in response to the ramp signal. A image controller is provided, which outputs the test analog signal and the ramp control signal, receives the digital signal output from the test ADC, and, if the digital signal is outside a predetermined specification, adjusts the ramp control signal such that the digital signal output from the test ADC is within the predetermined specification.

The normal ADC may include a plurality of correlated double sampling (CDS) units, which sample the analog signals, output from the pixels. The normal ADC also includes a plurality of comparison units, which are connected to the CDS units and the ramp signal generator. The comparison units compare output signals of the CDS units with the ramp signal. A plurality of latch units is provided, which latch output signals of the comparison units and digital signals output from a counter and outputs the latched signals. The counter, which is connected to the latch units, receives a clock signal, counts a number of pulses of the clock signal while the output signals of the comparison units are active, and transmits the counted number of pulses to the latch units as the digital signals.

The test ADC may include a test CDS unit, which samples the test analog signal, a test comparison unit, which is connected to the test CDS unit and the ramp signal generator, and compares an output signal of the test CDS unit with the ramp signal and a test latch unit, which latches a signal output from the test comparison unit and a digital signal output from the counter and outputs the latched signals. The counter counts the number of pulses of the clock signal while the output signal of the test comparison unit is active and transmits the counted number of pulses to the test latch unit.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth therein; rather, these embodiments are provided so that this disclosure will be thorough and complete, and will fully convey the concept of the invention to those skilled in the art. Like reference numerals in the drawings denote like elements.

Figure 3:
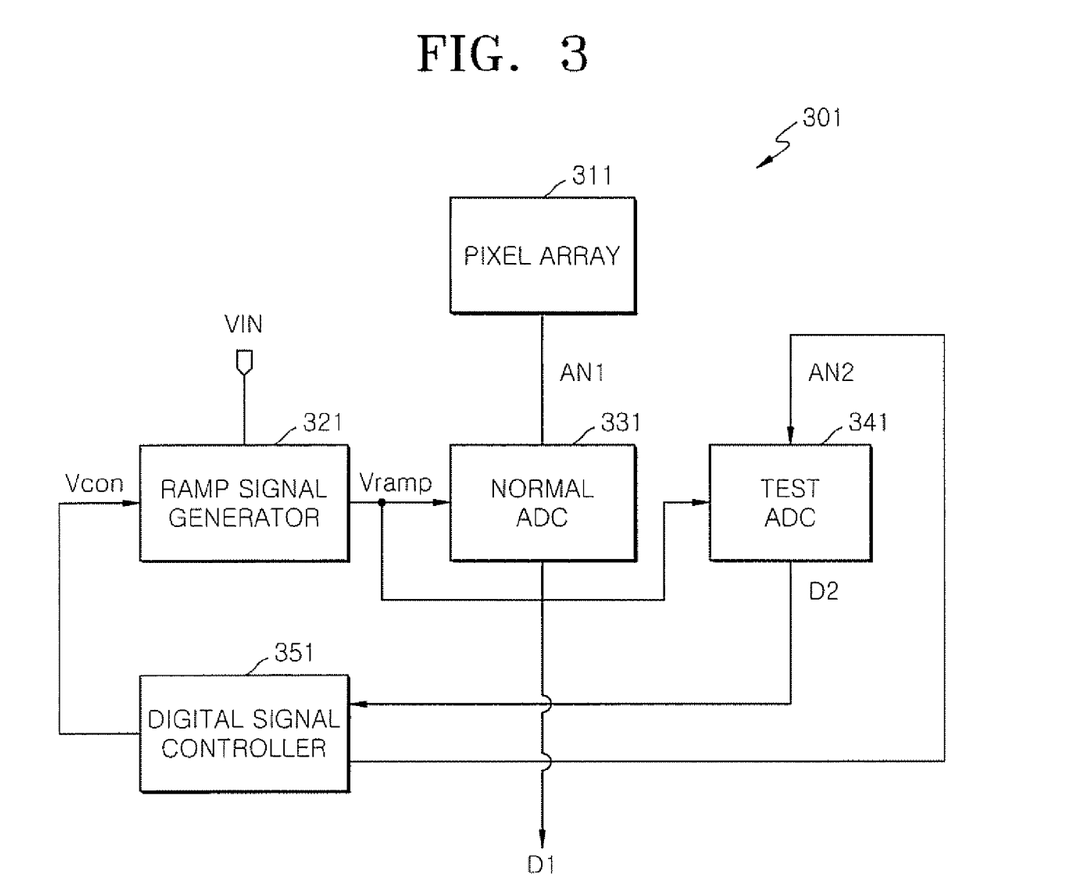
FIG. 3 is a block diagram of a CMOS image-photographing device according to an embodiment of the present invention.

FIG. 3 is a block diagram of a complementary metal oxide semiconductor (CMOS) image-photographing device 301 according to an embodiment of the present invention. Referring to FIG. 3, the CMOS image-photographing device 301 includes a pixel array 311, a ramp signal generator 321, a normal analog-to-digital converter (ADC) 331, a test ADC 341, and a digital signal controller 351. The pixel array 311 includes a plurality of pixels (see pixels 315 of FIG. 7) and outputs an optical signal from an external source as an analog signal AN1. The pixel array 311 may be an active pixel array (APS). The ramp signal generator 321 generates a ramp signal Vramp in response to a ramp control signal Vcon output from the digital signal controller 351. The normal ADC 331 converts the analog signal AN1 output from the pixel array 311 into a digital signal D1 in response to the ramp signal Vramp and outputs the digital signal D1.

The normal ADC 331 may be a columnar ADC. The test ADC 341 converts a test analog signal AN2 output from the digital signal controller 351 into a digital signal D2 in response to the ramp signal Vramp. The test ADC 341 and the normal ADC 331 are formed using the same manufacturing process under similar conditions. Hence, the test ADC 341 has the same operating characteristics as those of the normal ADC 331. Because the test ADC 341 and the normal ADO 331 have the same operating characteristics, the gain characteristics of the test ADC 341 can be measured to identify the gain characteristics of the normal ADC 331.

While the CMOS image-photographing device 301 operates, the gain characteristics of the normal ADC 331 cannot be reliably measured. To address this limitation, the operating characteristics of the test ADC 341 are measured to identify the operating characteristics of the normal ADC 331 while the CMOS image-photographing device 301 operates. Instead of additionally implementing the test ADC 341, a conventional dummy ADC is used as the test ADC 341. Therefore, although the CMOS image-photographing device 301 further includes the test ADC 341, the size of the CMOS image-photographing device 301 is the same as that of the conventional CMOS image-photographing device 101. The test ADC 341 may be a columnar ADC.

The digital signal controller 351 outputs the test analog signal AN2 to the test ADC 341, receives the digital signal D2 output from the test ADC 341, and identifies the gain characteristics of the test ADC 341 based on the digital signal D2. If the gain characteristics of the test ADC 341 are outside a predetermined specification, the digital signal controller 351 generates the ramp control signal Vcon and provides the ramp control signal Vcon to the ramp signal generator 321. Then, the ramp signal generator 321 adjusts a voltage of the ramp signal Vramp in response to the ramp control signal Vcon and transmits the ramp signal Vramp having the adjusted voltage to the normal ADC 331 and the test ADC 341. As the voltage of the ramp signal Vramp is adjusted, the gain characteristics of the normal ADC 331 and the test ADC 341 are changed. Following this adjustment, the digital signal controller 351 receives the digital signal D2 output from the test ADC 341 and identifies whether the gain characteristics of the test ADC 341 are within the predetermined specification. If the gain characteristics of the test ADC 341 are outside the predetermined specification, the digital signal controller 351 repeats the above process until the gain characteristics of the test ADC 341 come within the specification.

As described above, the CMOS image-photographing device 301 includes the ramp signal generator 321 and the test ADC 341, and checks, at any time necessary, the gain characteristics of the test ADC 341 independently of the operation of the normal ADC 331. If the gain characteristics of the test ADC 341 are outside the predetermined specification, the CMOS image-photographing device 301 adjusts the voltage of the ramp signal Vramp generated by the ramp signal generator 321 such that the gain characteristics of the normal ADC 331 and the test ADC 341 are within the predetermined specification. In other words, the CMOS image-photographing device 301 self-adjusts its gain characteristics. The CMOS image-photographing device 301 may include more than one normal ADC 331 and test ADC 341. The CMOS image-photographing device 301 may be configured in a single semiconductor chip.

Figure 4:
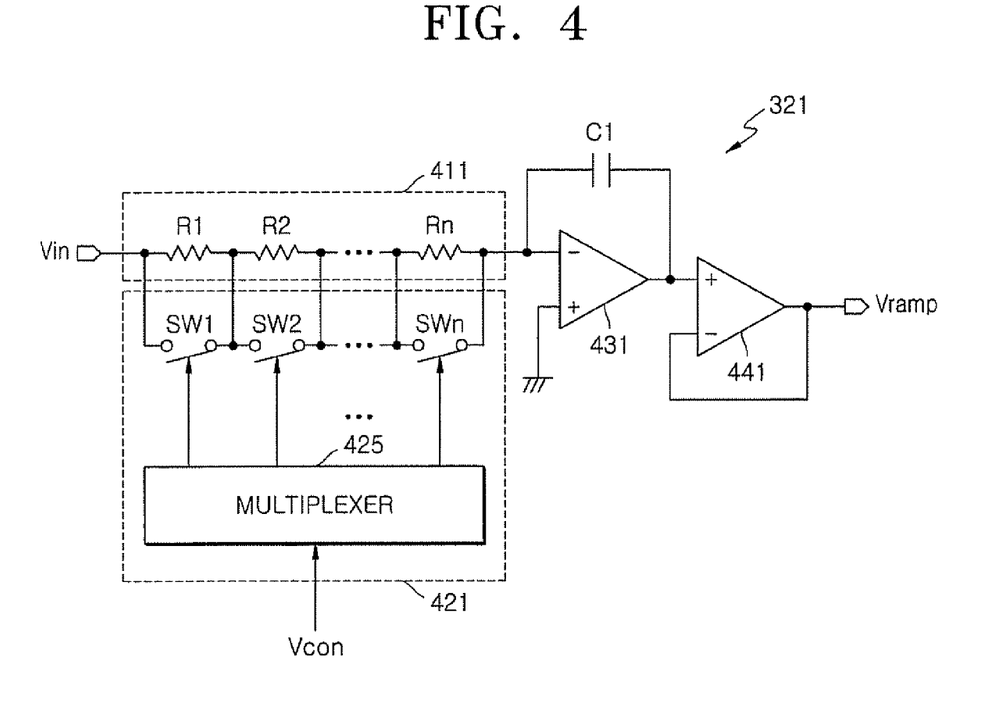
FIG. 4 is an electrical schematic of a ramp signal generator of FIG. 3 according to an embodiment of the present invention.

FIG. 4 is a block diagram of the ramp signal generator 321 of FIG. 3 according to an embodiment of the present invention. Referring to FIG. 4, the ramp signal generator 321 includes a resistor array 411, a ramp signal controller 421, a capacitor C1, an operational amplifier 431, and a buffer 441. The resistor array 411 includes a plurality of resistors R1 through Rn connected in series and receives an input voltage Vin from an external source. The ramp signal controller 421 is connected to the resistor array 411 and controls connection and disconnection of the resistors R1 through Rn in response to the ramp control signal Vcon.

The ramp signal controller 421 includes a plurality of resistance control switches SW1 through SWn and a multiplexer 425. The resistance control switches SW1 through SWn are respectively connected to the resistances R1 through Rn in parallel. The multiplexer 425 is connected to the resistance control switches SW1 through SWn and opens or closes the resistance control switches SW1 through SWn in response to the ramp control signal Vcon. A resistance of the resistor array 411 is changed according to whether the resistance control switches SW1 through SWn are opened or closed. In other words, as the number of open resistance control switches SW1 through SWn becomes greater than that of closed resistance control switches SW1 through SWn, so does the resistance of the resistor array 411. Conversely, as the number of open resistance control switches SW1 through SWn becomes smaller than that of closed resistance control switches SW1 through SWn, so does the resistance of the resistor array 411.

The operational amplifier 431 is connected to the resistor array 411. The operational amplifier 431 includes an inverted input terminal (−) and a non-inverted input terminal (+). A signal output from the resistor array 411 is input to the inverted input terminal (−), and the non-inverted terminal (+) is connected to a round source. Alternatively, a non-zero reference voltage may be applied to the non-inverted input terminal (+). In this case, the difference between the input voltage Vin and the reference voltage is input to the operational amplifier 431. The operational amplifier 431 integrates the input voltage Yin based on the resistance of the resistor array 411 and the capacitance of the capacitor C1. In other words, an output signal of the operational amplifier 431 is determined by Equation (1):

$$V_{out} = -\frac{V_{in}}{R \times C} \times t \quad (1)$$

As illustrated in Equation 1, the output voltage of the operational amplifier 431 is proportional to the input voltage Vin and is inversely proportional to the resistance of the resistor array 411 multiplied by the capacitance of the capacitor C1. The capacitor C1 is connected between the resistor array 411 and an output terminal of the operational amplifier 431. The buffer 441, which is connected to the output terminal of the operational amplifier 431, buffers the output signal of the operational amplifier 431, and outputs the buffered signal as the ramp signal Vramp. As described above, the ramp signal generator 321 can adjust the resistance of the resistor array 411 using the resistances R1 through Rn, the resistance control switches SW1 through SWn, and the multiplexer 425 included therein. Accordingly, the voltage of the ramp signal Vramp can be adjusted.

Figure 5:
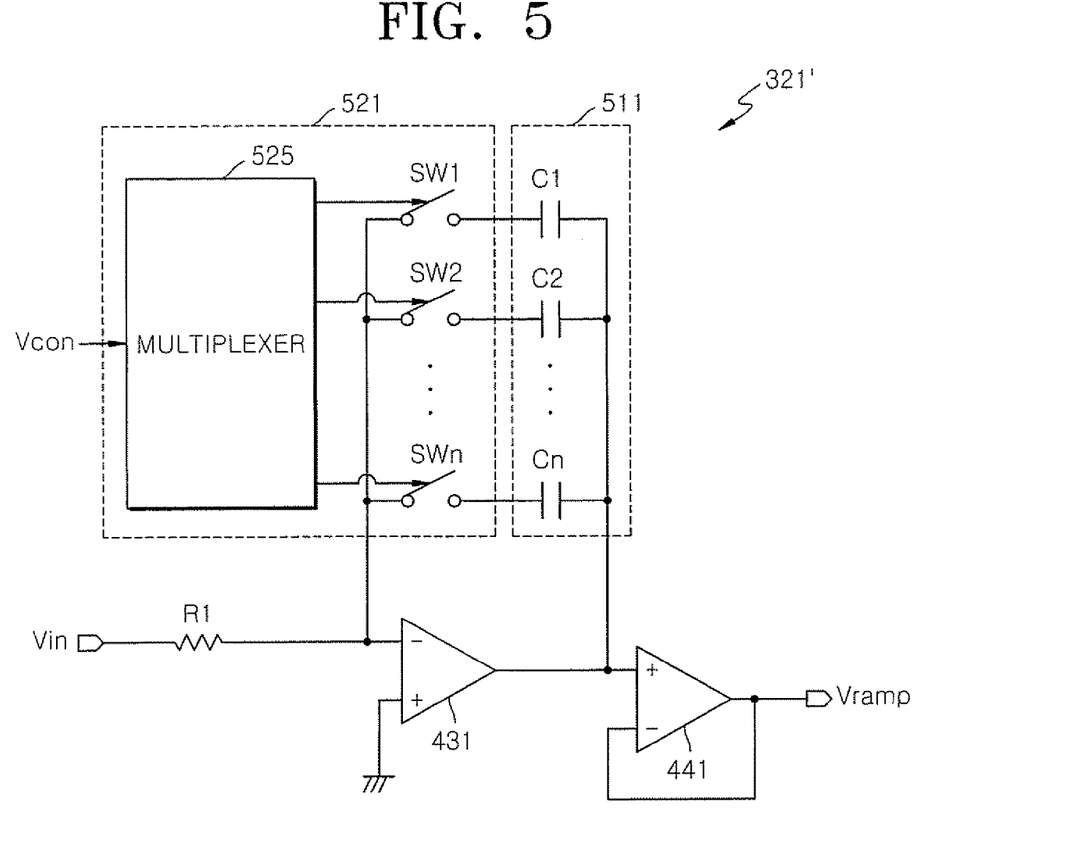
FIG. 5 is a block diagram of a ramp signal generator of FIG. 3 according to another embodiment of the present invention.

FIG. 5 is a block diagram of a ramp signal generator 321' according to another embodiment of the present invention. Referring to FIG. 5, the ramp signal generator 321' includes a resistance R1, a capacitor array 511, a ramp signal controller 521, an operational amplifier 431, and a buffer 441. An input voltage Vin from an external source is applied to the resistor R1. The capacitor array 511 is connected between the resistor R1 and an output terminal of the operational amplifier 431. The capacitor array 511 includes a plurality of capacitors C1 through Cn connected to one another in parallel. The ramp signal controller 521 is connected to the capacitors C1 through Cn and controls the connection and disconnection of the capacitors C1 through Cn in response to a ramp control signal Vcon.

The ramp signal controller 521 includes a plurality of capacitor control switches SW1 through SWn and a multiplexer 525. The capacitor control switches SW1 through SWn are respectively connected in series to the capacitors C1 through Cn. The multiplexer 525 is connected to the capacitor control switches SW1 through SWn and opens or closes the capacitor control switches SW1 through SWn in response to the ramp control signal Vcon. The capacitance of the capacitor array 511 is changed according to whether the capacitor control switches SW1 through SWn are opened or closed. In other words, as the number of open capacitor control switches SW1 through SWn becomes greater than that of closed capacitor control switches SW1 through SWn, the capacitance of the capacitor array 511 becomes smaller. Conversely, as the number of open capacitor control switches SW1 through SWn becomes smaller than that of closed capacitor control switches SW1 through SWn, the capacitance of the capacitor array 511 becomes greater.

The resistor R1 is connected to the operational amplifier 431. The operational amplifier 431 includes an inverted input terminal (−) and a non-inverted input terminal (+). A signal output from the resistor R1 is input to the inverted input terminal (−), and the non-inverted terminal (+) is connected to a ground source. A reference voltage may be applied to the non-inverted input terminal (+). In this case, the difference between the input voltage Vin and the reference voltage is input to the operational amplifier 431. The operational amplifier 431 integrates the input voltage Vin based on the resistance of the resistor R1 and the capacitance of the capacitor array 511. In other words, an output signal of the operational amplifier 431 is determined by Equation 1. As illustrated in Equation 1, the output voltage of the operational amplifier 431 is inversely proportional to the resistance of the resistor R1 multiplied by the capacitance of the capacitor array 511. The buffer 441 is connected to an output terminal of the operational amplifier 431, buffers the output signal of the operational amplifier 431, and outputs the buffered signal as the ramp signal Vramp. As described above, the ramp signal generator 321' can adjust the capacitance of the capacitor array 511 using the capacitors C1 through Cn, the capacitor control switches SW1 through SWn, and the multiplexer 525 included therein. Accordingly, the voltage of the ramp signal Vramp can be adjusted.

Figure 6:
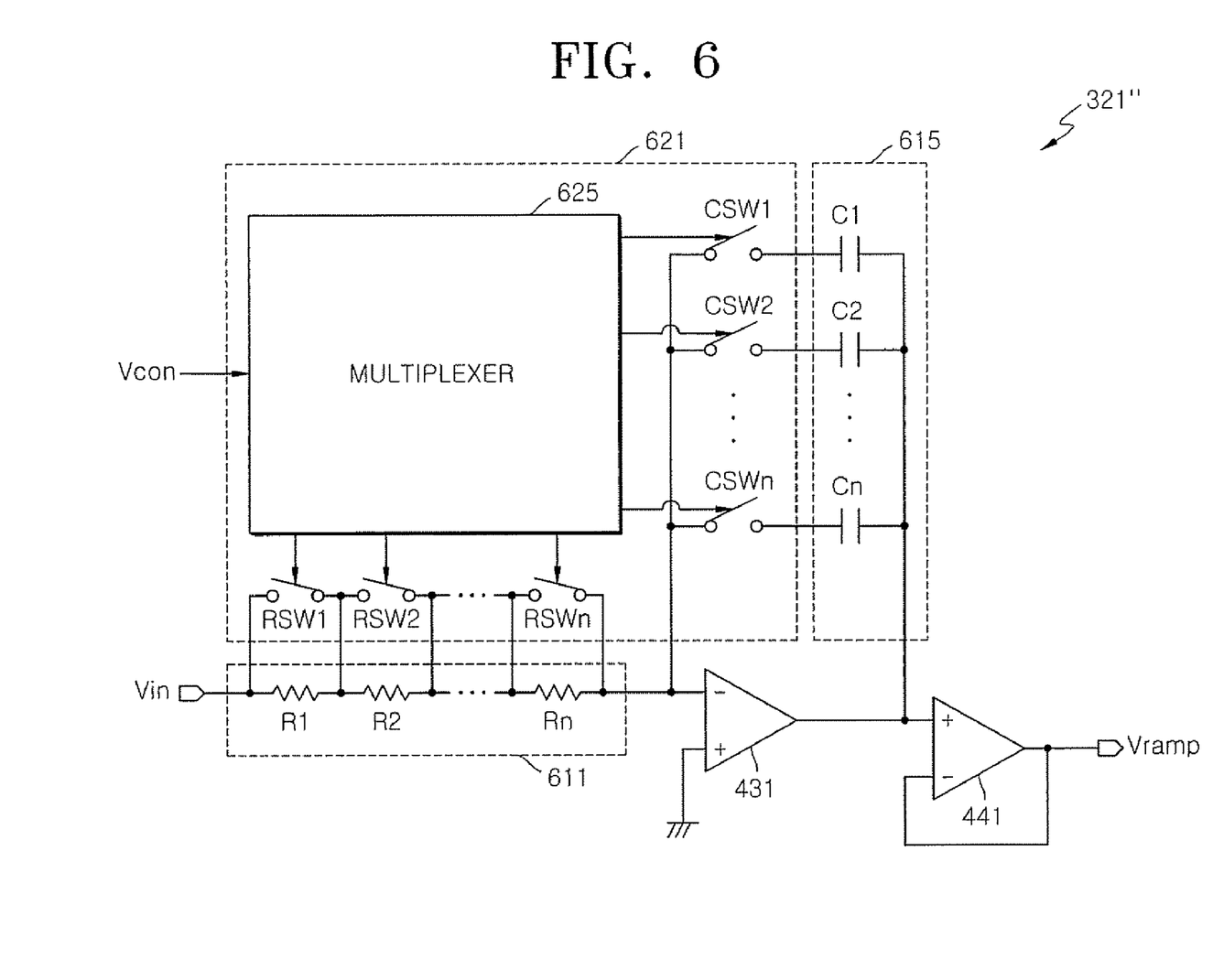
FIG. 6 is a ramp signal generator of FIG. 3 according to another embodiment of the present invention.

FIG. 6 is a ramp signal generator 321" according to another embodiment of the present invention. The ramp signal generator 321" of FIG. 6 combines aspects of the ramp signal generators 321 and 321' of FIGS. 4 and 5. In other words, referring to FIG. 6, the ramp signal generator 321" includes a resistor array 611, a capacitor array 615, a ramp signal controller 621, an operational amplifier 431, and a buffer 441. The resistor array 611 includes a plurality of resistors R1 through Rn connected to one another in series and receives an input voltage Vin. The capacitor array 615 is connected to a plurality of capacitor to control switches CSW1 through CSWn and an output terminal of the operational amplifier 431 and includes a plurality of capacitors C1 through Cn connected to one another in parallel. The ramp signal controller 621 is connected to the resistor array 611 and the capacitor array 615 and controls the connection and disconnection of the resistors R1 through hi and the capacitors C1 through Cn in response to a ramp control signal Vcon.

The ramp signal controller 621 includes a plurality of resistance control switches RSW1 through RSWn, a plurality of capacitor control switches CSW1 through CSWn, and a multiplexer 625. The resistance control switches RSW1 through RSWn are respectively connected in parallel to the resistors R1 through Rn. The capacitor control switches CSW1 through CSWn are respectively connected in series to the capacitors C1 through Cn. The multiplexer 625 is connected to the resistance control switches RSW1 through RSWn and the capacitor control switches CSW1 through CSWn and opens or closes the resistance control switches RSW1 through RSWn and the capacitor control switches CSW1 through CSWn in response to the ramp control signal Vcon. The resistance of the resistor array 611 is changed according to whether the resistance control switches RSW1 through RSWn are opened or closed. Also, the capacity of the capacitor array 615 is changed according to whether the capacitor control switches CSW1 through CSWn are opened or closed.

The resistor array 611 is connected to the operational amplifier 431. The operational amplifier 431 integrates the input voltage Vin based on the resistance of the resistor array 611 and the capacitance of the capacitor array 615. In other words, an output signal of the operational amplifier 431 is determined by Equation 1. As illustrated in Equation 1, the output voltage of the operational amplifier 431 is proportional to the input voltage Vin and is inversely proportional to the resistance of the resistor array 611 multiplied by the capacitance of the capacitor array 615. The buffer 441 is connected to an output terminal of the operational amplifier 431, buffers the output signal of the operational amplifier 431, and outputs the buffered signal as the ramp signal Vramp.

As described above, the ramp signal generator 321" can change the resistance of the resistor array 611 and the capacitance of the capacitor array 615 using the resistors R1 through Rn, the capacitors C1 through Cn, the resistance control switches RSW1 through RSWn, the capacitor control switches CSW1 through CSWn, and the multiplexer 625 included therein. Accordingly, the voltage of the ramp signal Vramp can be adjusted. A change in the resistance of the resistor array 611 results in a slight change in the ramp signal Vramp, and a change in the capacitance of the capacitor array 615 results in a large change in the ramp signal.

Figure 7:
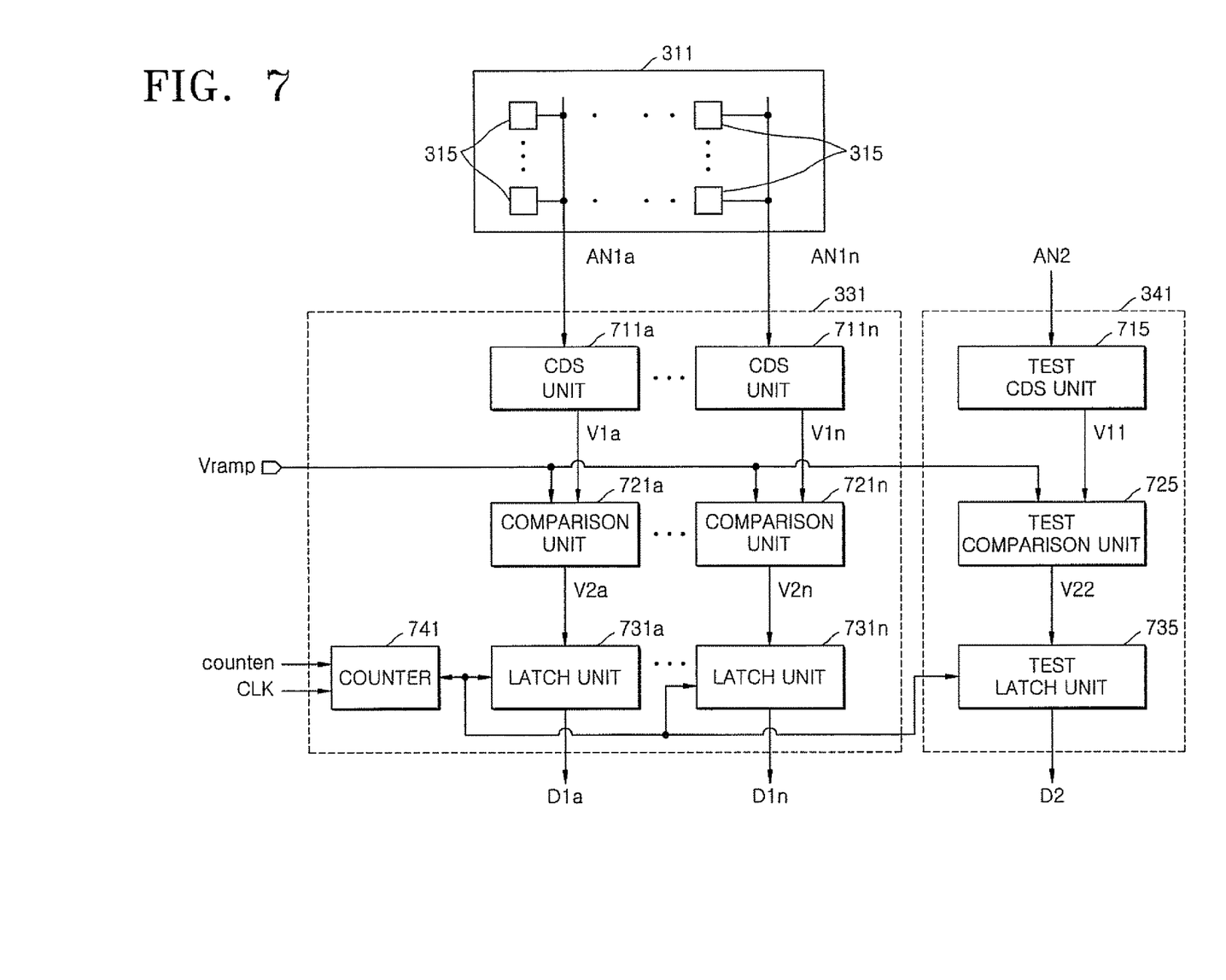
FIG. 7 is a detailed block diagram of a pixel array, a normal analog-to-digital converter (ADC), and a test ADC illustrated in FIG. 3.

FIG. 7 is a detailed block diagram of the pixel array 311, the normal ADC 331, and the test ADC 341 illustrated in FIG. 3. Referring to FIG. 7, the pixel array 311 includes the pixels 315. The normal ADC 331 includes a plurality of correlated double sampling (CDS) units 711a through 711n, a plurality of comparison unit 721a through 721n, a plurality of latch units 731a through 731n, and a counter 741. The CDS units 711a through 711n sample, that is, read, analog signals AN1a through AN1n output from the pixels 315 twice. The comparison units 721a through 721n receive output signals V1a through V1n of the CDS units 711a through 711n and the ramp signal Vramp and output signals V2a through V2n (i.e., voltage differences between the output signals V1a through V1n and the ramp signal Vramp). For example, when the voltage of the ramp signal Vramp is lower than the voltage of the output signals V1a through V1n of the CDS units 711a through 711n, the output signals V2a through V2n of the comparison units 721a through 721n become logic low. When the voltage of the ramp signal Vramp is higher than the voltage of the output signals V1a through V1n of the CDS units 711a through 711n, the output signals V2a through V2n of the comparison units 721a through 721n become logic high.

The latch units 731a through 731n receive the output signals V2a through V2n of the comparison units 721a through 721n and latch digital signals transmitted from the counter 741 and output digital signals D1a through D1n. The counter 741 is connected to the latch units 731a through 731n. The counter 741 receives a clock signal CLK and a count enable signal (counten) from an external source and starts to count the number of pulses of the clock signal CLK while the count enable signal (counten) is enabled and the output signals V2a through V2n of the comparison units 721a through 721n are active. Then, when the output signals V2a through V2n of the comparison units 721a through 721n become inactive, for example, when the output signals V2a through V2n of the comparison units 721a through 721n switch from logic high to logic low, the counter 741 stops counting the number of pulses of the clock signal CLK. The counter 741 transmits the counted number of pulses of the clock signal CLK to the latch units 731a through 731n as the digital signals. The normal ADC 331 outputs the digital signals D1a through D1n latched by the latch units 731a through 731n.

The test ADC 341 includes a test CDS unit 715, a test comparison unit 725, and a test latch unit 735. The test CDS unit 715 samples an input test analog signal AN2 and outputs a signal V11. The test comparison unit 725 receives and compares the signal V11 output from the test CDS unit 715 and the ramp signal Vramp and outputs the voltage difference between the signal V11 and the ramp signal Vramp as an output signal V22. For example, when the voltage of the ramp signal Vramp is lower than that of the output signal V11 of the test CDS unit 715, the output signal V22 of the test comparison unit 725 becomes logic low. When the voltage of the ramp signal Vramp is higher than that of the output signal V11 of the test CDS unit 715, the output signal V22 of the test comparison unit 725 becomes logic high. The test latch unit 735 receives the output signal V22 of the test comparison unit 725 and latches a digital signal transmitted from the counter 741 and outputs a digital signal D2.

Figure 8:
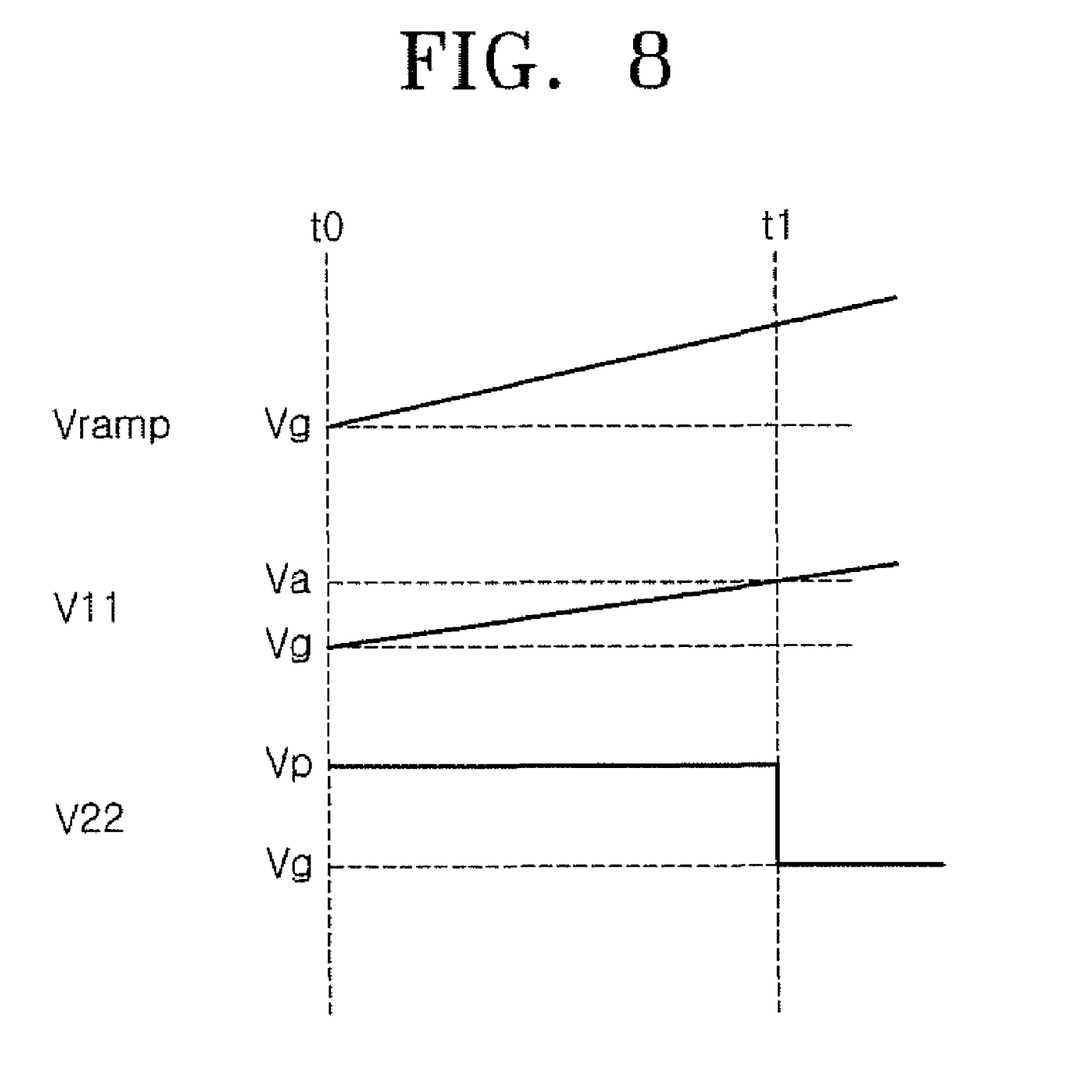
FIG. 8 is a timing diagram of signals for illustrating operations of the test ADC illustrated in FIG. 7.

FIG. 8 is a timing diagram of signals for illustrating the operation of the test ADC 341 illustrated in FIG. 7. A method of measuring the operating characteristics and gain characteristics of the test ADC 341 will now be described with reference to FIG. 8. The test analog signal AN2 is transmitted to the test CDS unit 715. Then, the test CDS unit 715 samples the test analog signal AN2 and transmits the output signal V11 to the test comparison unit 725. The voltage of the ramp signal Vramp gradually increases from a ground voltage Vg at an initial time t0. Then, the test comparison unit 725 compares the ramp signal Vramp with the output signal V11 of the test CDS unit 715 and outputs the comparison result. When the voltage of the output signal V22 of the test CDS unit 715 becomes higher than that of the ground voltage Vg, the counter 741 starts to count the number of pulses of the clock signal CLK.

When the voltage of the output signal V11 of the test CDS unit 715 reaches a threshold voltage Va at time t1, the voltage of the output signal V22 of the test comparison unit 725 switches to the ground voltage Vg. That is, the output signal V22 of the test comparison unit 725 becomes inactive. At this moment, the counter 741 stops counting the number of pulses of the clock signal CLK. The number of pulses of the clock signal CLK counted by the counter 741 is latched in the test latch unit 735.

The digital signal controller 351 of FIG. 3 receives the digital signal D2 output from the test latch unit 735 and identifies the gain characteristics of the test ADC 341. In other words, the digital signal controller 351 identifies the gain characteristics of the normal ADC 331. The digital signal controller 351 may further include at least one test pin (not shown) connected to the test ADC 341. By applying an external analog signal or two DC voltages having different voltages to the test pin, the digital signal controller 341 can measure the digital signal D2 output from the test ADC 341 and check the operating characteristics of the normal ADC 331 based on the digital signal D2. As described above, the CMOS image-photographing device 301 according to the present invention includes the ramp signal generator 321 and the test ADC 341 and can check, at any time necessary, the gain characteristics of the test ADC 341 independently of the operation of the normal ADC 331. If the gain characteristics of the test ADC 341 are outside the predetermined specification, the CMOS image photographing device 301 can adjust a value (or values) of a resistor (or resistors) and a capacitance (or capacitances) of a capacitor (or capacitors) included in the ramp signal generator 321 using the digital signal controller 351 such that the gain characteristics of the normal ADC 331 are within the predetermined specification. Therefore, the gain characteristics of the CMOS image-photographing device 301 can be optimized and its production yield can be enhanced.

Thus, as described above and illustrated by FIGS. 3–7, an image capture device with self-adjustable gain characteristic includes an array of pixel elements 311 configured to convert an image received as light at a surface thereof into analog output signals (e.g., AN1a, . . . , AN1n). A ramp signal generator 321, 321' or 321" is provided. The ramp signal generator is configured to generate a ramp voltage (Vramp) in response to a ramp control signal (Vcon). A normal analog-to-digital converter 331 is provided. The normal ADC 331 is configured to generate first digital signals D1a, . . . , D1n in response to the analog output signals and the ramp voltage. In some embodiments of the invention, the self-adjustable gain characteristic of the image capture device is provided by a test analog-to-digital converter 341 and a digital signal controller 351. The test ADC 341 is configured to generate test digital signals D2 in response to test analog signals AN2 and the ramp voltage. The digital signal controller is configured to generate the ramp control signal and the test analog signals in response to the test digital signals. In some embodiments of the invention, the ramp signal generator 321, normal APC 331, the test ADC 341 and the digital signal controller 351 collectively form an image processing circuit.

Referring now to FIGS. 4–6, the ramp signal generator 321 (or 321' or 321") includes an integration circuit with an adjustable RC time constant (see, e.g., Equation (1), where the product of R and C represents a time constant). This adjustable RC time constant is provided by including a resistor array (411, 611) and/or a capacitor array (511, 615) within the integration circuit. This resistor array and/or capacitor array is electrically coupled to an operational amplifier 431 within the integration circuit. The ramp signal generator further comprises a ramp signal controller 421 (521, 621) electrically coupled to the resistor array and/or capacitor array. The ramp signal controller is responsive to the ramp control signal Vcon. The ramp signal controller may include a multiplexer 425 (525 or 625) responsive to the ramp control signal.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An image capture device, comprising:
   an array of pixel elements configured to convert an image received as light at a surface thereof into analog output signals;
   a ramp signal generator configured to generate a ramp voltage in response to a ramp control signal;
   a first analog-to-digital converter configured to generate first digital signals in response to the analog output signals and the ramp voltage;
   a test analog-to-digital converter configured to generate a test digital signal in response to a test analog signal and the ramp voltage; and
   a digital signal controller configured to generate the ramp control signal and the test analog signal in response to the test digital signal.

2. The image capture device of claim 1, wherein said ramp signal generator comprises an integration circuit having a resistor array and/or capacitor array therein electrically coupled to an operational amplifier.

3. The image capture device of claim 1, wherein said ramp signal generator further comprises a ramp signal controller electrically coupled to the resistor array and/or capacitor array.

4. The image capture device of claim 3, wherein the ramp signal controller is responsive to the ramp control signal.

5. The image capture device of claim 4, wherein the ramp signal controller comprises a multiplexer responsive to the ramp control signal.

6. The image capture device of claim 1, wherein said test analog-to-digital converter comprises a correlated doubling sampling unit therein responsive to the test analog signal.

7. The image capture device of claim 1, wherein said digital signal controller is configured to adjust the ramp control signal to a level that operates to maintain a gain characteristic of said test analog-to-digital converter within a predetermined specification.

8. The image capture device of claim 7, wherein said first analog-to-digital converter comprises:
   a plurality of correlated double sampling units configured to sample the analog output signals;
   a plurality of comparison units configured to compare signals output from said plurality of correlated double sampling units with the ramp voltage; and
   a plurality of latch units electrically coupled to outputs of said plurality of comparison units.

9. The image capture device of claim 8, wherein test analog-to-digital converter comprises:
   a test correlated double sampling unit configured to sample the test analog signal;
   a test comparison units configured to compare a signal output from said test correlated double sampling unit with the ramp voltage; and
   a latch unit electrically coupled to an output of said test comparison unit.

10. A ramp signal generator generating a ramp signal required to convert an analog signal output from a pixel sensor which is included in a complementary metal oxide semiconductor (CMOS) image photographing device into a digital signal, the generator comprising:
    a resistor array, which receives an input, signal from an external source and comprises a plurality of resistors;

a ramp signal controller, which is connected to the resistor array and controls connection and disconnection of the resistors in response to a ramp control signal from an external source;

an operational amplifier which integrates a signal output from the resistor array and outputs the integrated signal as the ramp signal; and at least one capacitor connected between the resistor array and an output terminal of the operational amplifier.

11. The generator of claim 10, wherein the ramp signal controller comprises:

a plurality of resistance control switches connected in parallel to the resistors; and a multiplexer, which is connected to the resistance, control switches and opens or closes the resistance control switches in response to the ramp control signal.

12. The generator of claim 11, wherein the operational amplifier comprises an inverted input terminal and a non-inverted input terminal, the signal output from the resistor array is input to the inverted input terminal, and the non-inverted input terminal is connected to a ground source.

13. The generator of claim 11, wherein the resistance control switches are respectively connected to the resistors.

14. The generator of claim 10, wherein the resistors are connected to one another in series.

15. The generator of claim 10, further comprising a buffer, which is connected to the output terminal of the operational amplifier, buffers an output signal of the operation amplifier, and outputs the buffered signal as the ramp signal.

16. The generator of claim 10, wherein the ramp signal is inversely proportional to a resistance of the resistor array multiplied by a capacitance of the at least one capacitor and is proportional to the input signal.

17. The generator of claim 10, wherein the at least one capacitor is comprised of a plurality of capacitors, and the ramp signal controller further comprises a plurality of capacitor control switches connected to the capacitors and another multiplexer which is connected to the capacitor control switches and opens or closes the capacitor control switches in response to the ramp control signal.

18. The generator of claim 17, wherein the capacitors are connected to one another in parallel.

19. The generator of claim 17, wherein the capacitor control switches are respectively connected in series to the capacitors.

* * * * *